(12) United States Patent
Bailey et al.

(10) Patent No.: US 7,122,872 B2
(45) Date of Patent: Oct. 17, 2006

(54) CONTROL OF STRESS IN METAL FILMS BY CONTROLLING THE ATMOSPHERE DURING FILM DEPOSITION

(75) Inventors: James F. Bailey, Meadows of Dan, VA (US); Ho Bun Chan, Summit, NJ (US); Louis T. Gomez, North Plainfield, NJ (US); Martin Haueis, Jena (DE)

(73) Assignee: Lucent Technologies Inc., Murray Hill, NJ (US)

( * ) Notice: Subject to any disclaimer, the term of this patent is extended or adjusted under 35 U.S.C. 154(b) by 143 days.

(21) Appl. No.: 10/441,458

(22) Filed: May 20, 2003

(65) Prior Publication Data

US 2004/0235296 A1 Nov. 25, 2004

(51) Int. Cl.
*H01L 21/14* (2006.01)
(52) U.S. Cl. ............... 257/414; 438/65; 257/E21.584
(58) Field of Classification Search ............. 257/414, 257/415, 421; 438/644, 654, 652, 65
See application file for complete search history.

(56) References Cited

U.S. PATENT DOCUMENTS

| | | | | |
|---|---|---|---|---|
| 4,716,071 | A * | 12/1987 | Roberts et al. | 428/209 |
| 6,181,063 | B1 * | 1/2001 | Shishido | 313/509 |
| 6,454,913 | B1 | 9/2002 | Rasmussen et al. | 204/192.15 |
| 6,464,844 | B1 | 10/2002 | Pichulo et al. | 204/192.15 |
| 6,479,166 | B1 | 11/2002 | Heuer et al. | 428/620 |
| 6,531,331 | B1 | 3/2003 | Bennett et al. | 438/48 |
| 6,561,627 | B1 | 5/2003 | Jarrold et al. | 347/54 |
| 6,574,026 | B1 | 6/2003 | Jin et al. | 359/224 |
| 6,584,857 | B1 * | 7/2003 | Furlani et al. | 73/800 |
| 6,596,132 | B1 | 7/2003 | Rasmussen et al. | 204/192.15 |
| 6,639,724 | B1 | 10/2003 | Bower et al. | 359/599 |
| 6,689,486 | B1 | 2/2004 | Ho et al. | 428/610 |
| 6,706,202 | B1 | 3/2004 | Sun et al. | 216/24 |
| 2002/0117728 | A1 * | 8/2002 | Brosnihan et al. | 257/446 |
| 2003/0171005 | A1 * | 9/2003 | Tsujikawa et al. | 438/785 |
| 2004/0087162 | A1 * | 5/2004 | Vogeli | 438/694 |

OTHER PUBLICATIONS

"Structure and Optical Properties fo TiN Films Prepared by DC Sputtering and by ION beam Assisted Deposition," by M. Bonelli, et al., Vacuum, 1992 Pergamon Press Ltd., vol. 43, Nos. 5-7, pp. 459-462.

"Influence of Substrate Properties on Growth of Titanium Films: Part II [1,2,3].," by M. Poppeller R. Abermann, Thin Solid Films 320 (1998) pp. 331-337.

"Curvature Compensation in Micromirrors with High-Reflectivity Optical Coatings," Ke cao et al., Journal of Microelectromachanical Systems, vol. 10 No. 3, Sep. 2002, pp. 409-417.

(Continued)

*Primary Examiner*—Bradley K. Smith

(57) ABSTRACT

Materials such as titanium are vapor-deposited in the presence of, e.g., oxygen to form a film on a substrate, such as to provide an adhesion layer between a silicon movable structure in an optical MEMS device and a gold layer serving as a reflecting surface. The resulting film contains titanium and oxygen. Varying the conditions under which the film is deposited varies the intrinsic stress of the film, which varies the change in substrate shape caused by the presence of the film. A film having a desired intrinsic stress may be obtained by control of the oxygen partial pressure when the film is deposited. In one embodiment, the oxygen partial pressure in the atmosphere present during titanium deposition is greater than about $2 \times 10^{-7}$ Torr, and preferably between about $1 \times 10^{-6}$ Torr and about $2 \times 10^{-6}$ Torr.

10 Claims, 2 Drawing Sheets

OTHER PUBLICATIONS

"Ultra-High Vacuum Measurements of the Internal Stress of PVD Titanium Films as a Function of Thickness and its Dependence on Substrate Temperature," by H.J. Schneeweiβ and R. Abermann, Vacuum, vol. 43, 1992 Pergamon Press Ltd., pp. 463-465.

* cited by examiner

CONTROL OF STRESS IN METAL FILMS BY CONTROLLING THE ATMOSPHERE DURING FILM DEPOSITION

BACKGROUND OF THE INVENTION

This invention relates to vapor-deposited films, and to controlling stress in such films. Vapor-deposited films are used, for example, in certain micro-electro-mechanical systems ("MEMS") devices. MEMS devices typically are fabricated using integrated circuit fabrication technology, and include movable structures such as tilting mirrors. A typical MEMS tilting mirror may include a conductive member and be resiliently mounted to a base. The base and the movable structure of a MEMS device are typically made of silicon. The base includes one or more fixed conductive electrodes that are supported, and are insulated from each other and from the movable conductive member, by dielectric material. Applying a potential difference between the movable conductive member and one or more of the fixed electrodes produces an attractive electrostatic force urging the movable structure toward the fixed electrodes. The resilient mounting (e.g., one or more springs) of the movable structure provides a restoring force.

In certain applications, a thin film may be applied to a portion of a MEMS device, such as by vapor deposition. For instance, in some optical MEMS devices such as optical cross-connects, the movable structure includes a micromirror having a reflecting surface in order to redirect an incident light beam in a controllable direction. The reflectivity of the material from which the movable structure is formed may be insufficient to provide an adequate reflecting surface in certain applications. In such applications, the material from which the movable structure is formed may be used as a structural element to provide a substrate for a reflecting surface, and another material may be disposed on the movable structure in order to provide the reflecting surface. For instance, in certain applications, the reflectivity of silicon may be inadequate, but the reflectivity of gold may be adequate; a thin film of gold deposited on a silicon movable structure substrate would provide it with an adequate reflecting surface.

However, gold adheres poorly to silicon. In order to adhere a gold layer to a silicon movable structure, a layer of material that adheres well to silicon and to gold may be disposed on the silicon movable structure as an "adhesion layer," and the gold layer may be disposed on the adhesion layer. Titanium is commonly used as an adhesion layer in composite thin film stacks, and is suitable for use as an adhesion layer between silicon and gold.

One of the important characteristics of a reflective surface for an optical cross-connect, as well as many other devices, is flatness; the reflective surface should be flat when the device is manufactured, and should remain flat for the lifetime of the device. However, mechanical stresses in metallic thin films applied to a substrate material of a MEMS device movable structure can cause the substrate to deform by bending, and the thin film, which conforms to the shape of the movable structure substrate, likewise bends. The change in the shape of the reflective surface due to film stress usually results in reduced optical performance. This is a particularly serious concern if the stress in the metallic films changes over time, for instance, due to creeping or if thermal expansion mismatch leads to additional stress buildup during device processing steps subsequent to film deposition.

The stress of a titanium layer can be reduced by decreasing its thickness. However, if a titanium layer is too thin, it becomes ineffective as an adhesion layer. When a titanium layer included in a thin film stack is thick enough to be suitable as an adhesion layer, its stress usually dominates the total stress of the stack. A number of ways have been suggested to reduce the effect of stress in a titanium film in a MEMS device.

One approach is to metallize both sides of a micromirror. If the metal films deposited on both sides of the micromirror were identical, their stresses would cancel each other and the micromirror's curvature would remain that same as it was prior to metallization. In practice, however, balancing the stress is problematic. Not only must the initial stress be exactly balanced, but the stress of the two metal films must also relax at the same rate so that they remain balanced over time. Any deviations from this ideal behavior may lead to curvature that deteriorates with time.

Optical MEMS devices frequently are made from two chips: a mirror chip having an array of movable micromirrors and an electrode chip having a correspondingly spaced array of driving electrode structures. In the device assembly process the two chips are brought together in registration and adhered to each other. Once the two chips are adhered to each other, the side of the micromirrors facing the electrode chip is inaccessible for metallizing, and so a device in which both sides of a mirror are metallized requires that the metallizing occur prior to adhering the mirror chip to the electrode chip. Therefore, the metal films deposited on both sides of such mirrors will be subjected to the assembly and packaging processes, which may involve relatively high temperatures. Because of relaxation at high temperatures and thermal expansion mismatch, the metal films pick up a considerable amount of tensile stress upon cooling to room temperature.

Another approach to reducing stress effects due to films deposited on micromirror substrates is robust mechanical design. For instance, to reduce the bending caused by a given amount of film stress, the substrate thickness could be increased. While a thicker substrate improves stress-induced curvature, it affects the mechanical properties of the micromirror, such as by lowering its resonant frequency, and it complicates the design of the springs that support the micromirror and allow it to tilt.

Balancing of stress by additional thin films to make the net bending moment zero is disclosed in "Curvature Compensation in Micromirrors With High-Reflectivity Optical Coatings," K. Cao, W. Liu, and J. Talghader, *Journal of Microelectromechanical Systems*, Vol. 10, No. 3, September 2001, 409–417. It has also been suggested to add thermal expansion-induced stress that compensates intrinsic thin film stress. These approaches add complexity to the fabrication process, and do not change the intrinsic thin film stress of the functional metal. In addition, the application of these techniques may be limited because of restrictions in mechanical layout, thermal budget, and stability as a function of time.

SUMMARY OF THE INVENTION

Problems of the prior art are addressed by controlling the conditions under which metal is deposited to form a film, so as to control the intrinsic stress of the film. Some embodiments of the invention include controlling the atmosphere in which metal is deposited from a vapor to form a film; in one such embodiment, titanium is deposited in the presence of oxygen to form a film, and the deposited film contains titanium and oxygen. Varying the conditions of such deposition varies the properties of the deposited film, including its intrinsic stress; a film having a desired intrinsic stress may be obtained by controlling the oxygen content of the atmosphere in which the film is deposited. Some embodiments of the invention include controlling the temperature at which metal is deposited from a vapor to form a film. For example, titanium may be deposited to form a film on a surface while the surface is thermally coupled to a temperature-controlling source. Varying the temperature conditions of such deposition varies the properties of the deposited film, including its intrinsic stress; a film having a desired intrinsic stress may be obtained by control of the temperature at which the film is deposited.

Stress may be controlled in a titanium film used as an adhesion layer in a micromirror for a MEMS device in order to control the curvature of the micromirror. Stress may be controlled in such an application so that the micromirror is substantially flat after device fabrication and packaging.

BRIEF DESCRIPTION OF THE DRAWINGS

The foregoing and other aspects, features, and advantages of the invention will become more fully apparent from the following detailed description, the appended claims, and the accompanying drawings in which:

DETAILED DESCRIPTION

Figure 1:
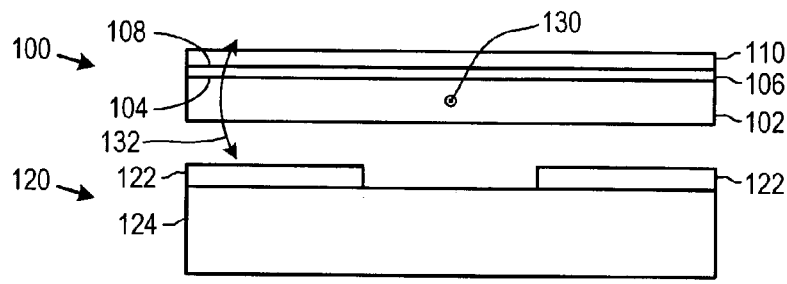
FIG. 1 is a schematic diagram illustrating a MEMS device that includes an adhesion layer between a substrate and a reflective layer.

FIG. 1 is a schematic diagram illustrating a MEMS device that includes an adhesion layer between a substrate and a reflective layer. The device includes a movable structure 100 that is resiliently mounted to a base 120 for rotation in the manner indicated by arc 132 about an axis 130 oriented perpendicular to the plane of the paper. Base 120 includes conductive electrodes 122 that are supported, and are insulated from each other and from movable structure 100, by dielectric material 124. Movable structure 100 includes conductive portions, and applying a potential difference between movable structure 100 and one of the electrodes 122 produces an attractive electrostatic force urging movable structure 100 toward that electrode. The resilient mounting (not shown) of movable structure 100 provides a restoring force.

Movable structure 100 includes a substrate layer 102, which may, for instance, be formed from single-crystal or polycrystalline silicon. On the upper surface 104 of substrate layer 102 is a metal film 106 applied to surface 104 by vapor deposition. On the upper surface 108 of film 106 is a metal film 110 applied to surface 108 by vapor deposition. Film 110 may be made of a metal with desired reflective properties, such as gold, and film 106 may be made of a metal with desired properties as an adhesion layer, such as titanium.

In accordance with the prior art, vapor-deposited films such as film 106 and film 110 are applied to a surface of a device by placing the device in a chamber that is coupled to a vacuum pump. The atmospheric air in the chamber is evacuated substantially to the extent possible with the equipment being used, so as to achieve substantially the lowest pressure within the chamber that the pump can maintain, commonly referred to as "base pressure." Typical vapor deposition apparatus provides base pressures below about $1 \times 10^{-6}$ Torr, and vapor-deposited films are usually applied below that pressure. A quantity of the metal to be deposited is heated in the chamber, e.g., by a thermal heater or an electron beam, to evaporate a quantity of the metal to be deposited. The surface to receive the metal film is disposed so as to be exposed to the metal vapor, and metal vapor condenses on the surface to form a film. The temperature of the device at the commencement of vapor deposition is whatever the ambient temperature is, typically room temperature. Metal vapor inpinging and condensing on the device surface raises the device temperature, and its temperature is not controlled during the vapor deposition process.

Figure 2:
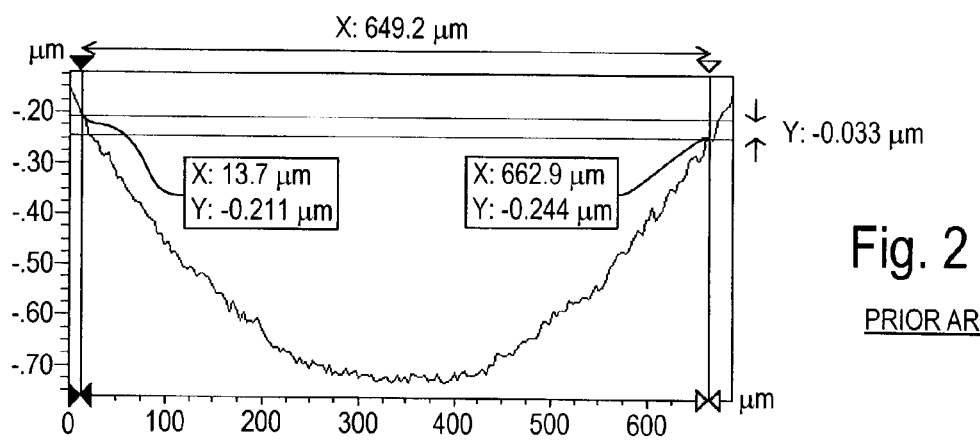
FIG. 2 is a graph showing the surface profile of a micromirror in which a titanium adhesion layer was deposited in accordance with the prior art.

FIG. 2 is a graph showing the surface profile of a micromirror in accordance with the prior art. The micromirror was formed on the bottom surface of an initially flat silicon substrate about 3 micrometers thick. A titanium adhesion layer was formed on the silicon substrate in accordance with the prior art. The silicon substrate was disposed in a chamber that was connected to and evacuated by a vacuum pump. The chamber was evacuated to a high vacuum, less than $5 \times 10^{-7}$ Torr. Under that condition, oxygen was substantially absent from the atmosphere within the chamber, the partial pressure of oxygen being less than $1 \times 10^{-7}$ Torr. Titanium was evaporated in the chamber, and portions of the titanium vapor in the chamber condensed onto the silicon substrate to provide a vapor-deposited titanium film about 4.5 nanometers thick. A gold layer about 35 nanometers thick was then vapor-deposited using a similar method, to complete the micromirror.

The profile of the micromirror surface shown in FIG. 2 was measured by optical interferometry. The radius of curvature of the micromirror surface is about 100 millimeters. The departure from flatness of the reflective surface results from the intrinsic stress of the titanium film, which is compressive.

Figure 3:
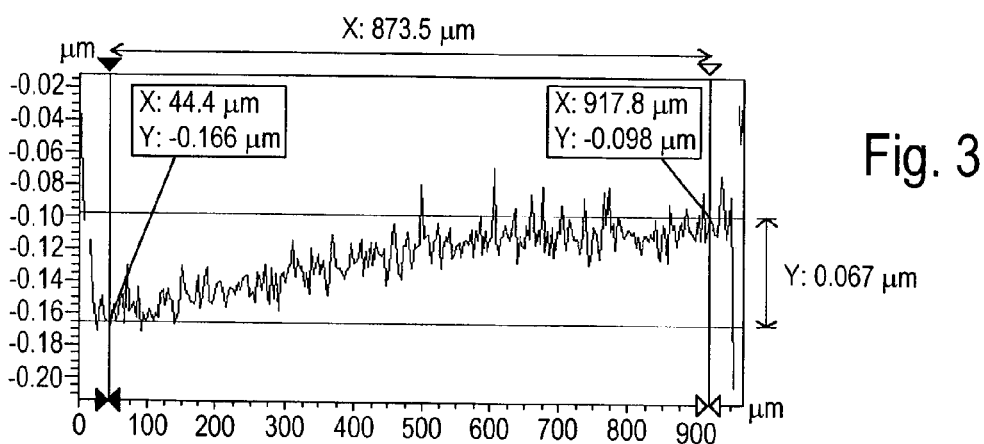
FIG. 3 is a graph showing the surface profile of a micromirror in accordance with an embodiment of the present invention in which a titanium adhesion layer was deposited in a controlled atmosphere.

FIG. 3 is a graph showing the surface profile of a micromirror in accordance with an embodiment of the present invention. The micromirror was formed on an initially flat silicon substrate by vapor deposition of titanium and gold films. The vapor deposition process was as described above with respect to the prior art, except that the partial pressure of oxygen during vapor deposition was higher. The vapor deposition chamber was coupled to an oxygen source through a valve for controlling oxygen flow into the chamber. After atmospheric air in the chamber had been evacuated to a pressure less than $5 \times 10^{-7}$ Torr, the valve was opened and oxygen was introduced into the chamber to provide an atmosphere having a pressure of about $1.5 \times 10^{-6}$ Torr. Because the atmosphere was substantially entirely oxygen, the oxygen partial pressure was substantially the same as the total chamber pressure. Titanium was then evaporated in the chamber, and portions of the titanium vapor in the chamber condensed onto the silicon substrate to provide a vapor-deposited titanium film about 4.5 nanometers thick. A gold layer about 35 nanometers thick was then vapor-deposited at base pressure.

The profile of the micromirror surface shown in FIG. 3 was measured by optical interferometry. The radius of curvature of the micromirror surface is greater than 5 meters. Such a curvature is sufficiently small as to substantially eliminate curvature-caused insertion loss in certain optical cross-connect devices. The curvature of the micromirror caused by the titanium film of FIG. 3 is more than 50 times smaller than the curvature of the micromirror caused by the titanium film of FIG. 2.

Deposition of titanium in the presence of oxygen results in a film containing titanium and oxygen. The oxygen component of the film provides a tensile component of intrinsic stress. The oxygen-related tensile component of intrinsic stress may be controlled by controlling the conditions of film deposition, for instance, by controlling the oxygen partial pressure during film deposition.

Figure 4:
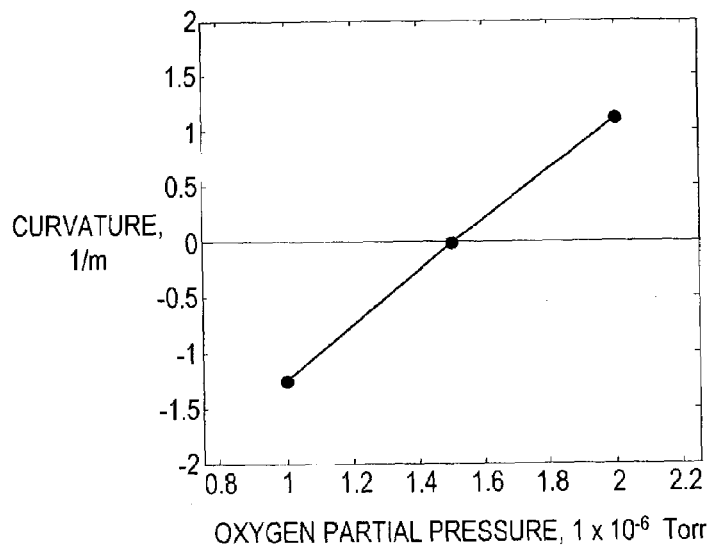
FIG. 4 is a graph illustrating micromirror curvature versus oxygen partial pressure during titanium deposition to form an adhesion layer.

FIG. 4 is a graph illustrating micromirror curvature versus the oxygen partial pressure existing during vapor deposition of a titanium-containing film on a silicon substrate. The curvature indicated is the inverse of the radius of curvature of the surface and is measured in inverse meters. The films were deposited using the method described above with respect to FIG. 3, i.e., the chamber was evacuated to a pressure less than $5 \times 10^{-7}$ Torr and oxygen was introduced through a valve to provide the specified partial pressure. When the film was deposited at about $1.0 \times 10^{-6}$ Torr oxygen partial pressure, the micromirror curvature was about $-1.25$ $m^{-1}$. When the film was deposited at about $1.5 \times 10^{-6}$ Torr oxygen partial pressure, the micromirror curvature was about zero. When the film was deposited at about $2.0 \times 10^{-6}$ Torr oxygen partial pressure, the micromirror curvature was about $+1.20$ $m^{-1}$. Thus, the intrinsic stress of the deposited film can be made negative, zero, or positive by selecting the oxygen partial pressure during film deposition.

The pressure within the chamber drops during titanium vapor deposition, due to chemical reaction between titanium and oxygen. For instance, during the vapor depositions referred to with respect to FIG. 4, the chamber pressure dropped below $5 \times 10^{-7}$ Torr, even though oxygen flow into the chamber continued. Thus, the oxygen partial pressures referred to herein are pressures at the start of vapor deposition.

The oxygen-containing titanium layers described provide acceptable adhesion for use as an adhesion layer between gold and silicon, and the inclusion of oxygen in a titanium adhesion layer does not appear to decrease the reflectivity of a gold layer deposited on it. Micromirrors made using adhesion layers in accordance with the invention have been found to remain flat after thermal treatment that occurs during the packaging process for the devices in which they are used.

In the foregoing embodiments, the composition of the atmosphere during vapor deposition includes oxygen in a greater percentage than that of atmospheric air. In another embodiment of the invention, titanium vapor is deposited in an atmosphere having the composition of atmospheric air at a pressure that is lower than atmospheric pressure. In such embodiments, atmospheric air is evacuated from the chamber, and the oxygen partial pressure during vapor deposition is controlled by controlling the pressure of the atmospheric air remaining in the chamber. For instance, oxygen partial pressure of about $1 \times 10^{-6}$ Torr can be obtained by evacuating the chamber to a pressure of about $5 \times 10^{-6}$ Torr.

As noted above, in prior art vapor deposition processes, the temperature of the surface onto which vapor is deposited is not controlled, and that temperature rises during the course of deposition of a film. Some embodiments of the invention include controlling the temperature at which metal is deposited from a vapor to form a film. For example, titanium may be deposited to form a film on a surface while the surface is thermally coupled to a temperature-controlling source. Varying the temperature conditions of such deposition varies the properties of the deposited film, including its intrinsic stress; a film having a desired intrinsic stress may be obtained by control of the temperature at which the film is deposited.

Figure 5:
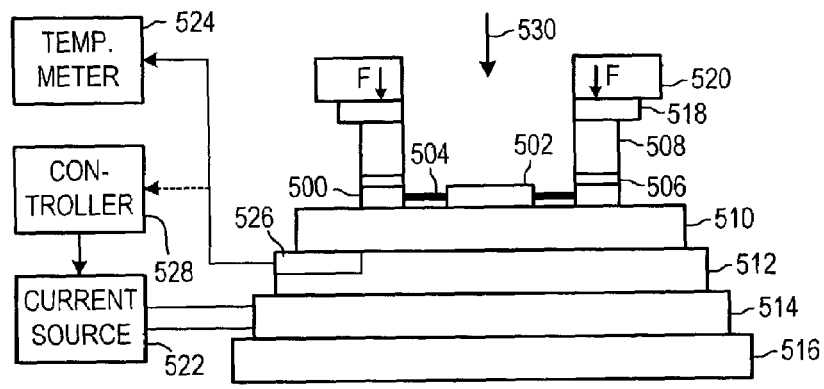
FIG. 5 is a schematic diagram illustrating apparatus for controlling the temperature at which vapor is deposited on a surface to form a film.

FIG. 5 is a schematic diagram illustrating apparatus for controlling the temperature at which vapor is deposited on a device surface to form a film. The device illustrated, on which vapor is to be deposited, is an optical MEMS device mirror chip being fabricated in a silicon-on-insulator ("SOI") wafer including a handle layer 508, an oxide layer 506, and a device layer 500. The device layer 500 includes a portion 502 that is 1) moveable so as to provide a substrate for a moveable reflecting element, and 2) to be metallized by metal vapor travelling in the direction indicated by arrow 530. Substrate portion 502 is connected to the surrounding area of device layer 500 by springs 504, which typically are of small cross-section and therefore have low thermal conductance. Thus, during vapor deposition the temperature of substrate portion 502 may rise substantially due to limited heat conduction through springs 504.

In order to control the temperature of the surface of a device on which vapor is deposited, the surface is thermally coupled to a temperature-controlling thermal source. In the apparatus of FIG. 5, in order to control the temperature of the surface of substrate portion 502 on which vapor is deposited, substrate portion 502 is thermally coupled through silicon wafer 510 and a copper foil layer 512 to a Peltier stage 514 mounted on a metal plate 516 acting as a heat sink. A Peltier stage or device is a thermoelectric device that includes a junction between dissimilar metals, in which current flow through the junction sources heat to or sinks heat from the junction. Peltier stage 514 is coupled to a current source 522. The direction of current flow from current source 522 to Peltier stage 514 controls whether Peltier stage 514 heats or cools substrate portion 502, and the magnitude of current flow from current source 522 to Peltier stage 514 controls the magnitude of heating or cooling. Silicon wafer 510 is included because such wafers are available with extremely flat surfaces, which provide close contact with substrate portion 502 and high thermal conductance. Intimate contact between device layer 500 and silicon wafer 510 is provided by a clamp, a portion 520 of which is shown, arranged to apply a force with respect to plate 516 which is illustrated by arrows F. The clamping force is applied through a thermally insulating layer 518, which may be made of glass, in order to reduce heat transfer between clamp portion 520 and the device receiving the vapor-deposited film.

An approximate indication of the temperature of substrate portion 502 can be obtained by measuring the temperature of copper foil layer 512. To this end, a temperature sensor 526 such as a thermocouple is mounted and thermally coupled to copper foil layer 512. The output signal of temperature sensor 526 is supplied to temperature meter 524 for display.

The temperature of substrate portion 502 can be controlled by controlling the magnitude and direction of current provided to Peltier stage 514 by current source 522. Controller 528 controls the magnitude and direction of current provided by current source 522. Such control may be open loop, or may be feedback control in response to the output signal of temperature sensor 526 as indicated by the dotted arrow.

Figure 6:
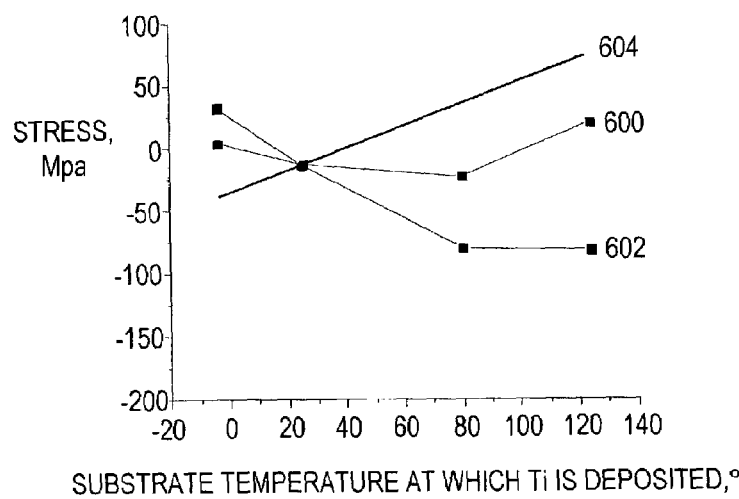
FIG. 6 is a graph illustrating stress of a titanium layer in a micromirror, measured at 25° C., versus substrate temperature during titanium deposition to form the layer.

FIG. 6 is a graph illustrating stress of a titanium layer in a micromirror, measured at 25° C., versus substrate temperature during titanium deposition to form the layer. The graph of FIG. 6 was generated using apparatus as illustrated in FIG. 5, in which micromirrors were formed on initially flat substrate portion 502 of an SOI wafer. A 4.5-nanometer thick titanium layer was vapor-deposited on silicon substrate portion 502 at the indicated temperature, and a 40-nanometer thick gold layer was vapor-deposited on the titanium layer at room temperature. The titanium layer was deposited after evacuating atmospheric air to a pressure less than $5 \times 10^{-7}$ Torr, providing oxygen partial pressure less than $1 \times 10^{-7}$ Torr.

The curvatures of the micromirrors were measured at room temperature, and the titanium film stress values shown in FIG. 6 were computed from the measured curvatures and the dimensions and materials of the micromirrors using well-known relationships, e.g., Stoney's equation, applicable when the stress in the metal film is small:

$$R = \left(\frac{E}{1-v}\frac{1}{6t_f}\frac{1}{\sigma}\right)t_s^2$$

where R is the radius of curvature of the mirror, σ is the stress in the metal film, E is the Young's modulus of the substrate, ν is the Poisson ratio of the substrate, $t_f$ is the thickness of the thin metal film, and $t_s$ is the thickness of the substrate, and the substrate is assumed to be stress-free.

The stress determined at room temperature is illustrated by curve 600, and the stress as corrected by the theoretical thermal expansion coefficient mismatch (shown by line 604) is illustrated by curve 602. Curve 602 indicates that the stress of the vapor-deposited titanium film at deposition temperature is tensile when the substrate is below about 20° C. during film deposition, and is compressive at deposition temperature when the substrate is above about 20° C. during film deposition. Accordingly, the stress of a vapor-deposited film can be controlled by controlling the substrate temperature during film deposition.

The apparatus of FIG. 5 provides active control of temperature, in that it includes a powered thermal source. Alternative well-known thermal sources may be used for active control of temperature, such as resistance heaters and mechanical refrigerators. Alternatively, embodiments of the invention may use passive temperature control. For instance, copper foil layer 512 and Peltier stage 514 might be omitted, and plate 516 might be brought into direct contact with, and close thermal coupling to, silicon wafer 510. If the thermal mass of plate 516 is sufficiently large, and the thermal conductance between plate 516 and substrate portion 502 is sufficiently high, then plate 516 may be brought to a desired temperature before vapor deposition is commenced, and its temperature and heat content may control the temperature of substrate portion 502 during vapor deposition.

After a micromirror has been formed by vapor deposition of one or more metal film layers on a substrate, the micromirror may be subjected to temperature changes, for instance, due to further processing and packaging steps in MEMS device fabrication. Such temperature changes can cause the curvature of a micromirror to change, for instance, due to differences in the coefficients of thermal expansion of the substrate and the metal film layers. Applicants have determined that curvature changes in micromirrors having a gold reflecting layer on a titanium adhesion layer caused by temperature changes are elastic if the temperature is maintained below about 60° C. That is, a micromirror's curvature will change from an initial value due to a temperature change, but if the temperature is maintained below about 60° C., the micromirror's curvature will return to its initial value when the temperature returns to its initial value. If a micromirror reaches temperatures above about 70° C. during processing and packaging steps of the sort frequently used in MEMS device fabrication, irreversible changes in curvature remain when the micromirror temperature returns to its initial value.

Such irreversible changes are believed to be due to yielding and stress relaxation in the gold film at higher temperatures; upon cooling, the gold layer contracts more than the silicon substrate and develops a tensile stress. The extent of such changes tends to be larger with higher peak temperatures. As has been noted, prior art MEMS device fabrication processes may include high temperature steps, such as heating to cure polyimide adhesives used to bond mirror chips to electrode chips. The stress-induced curvature introduced by such processing steps can be difficult to control and compensate. To avoid such irreversible stress-induced curvature, micromirror temperatures during MEMS device fabrication processes preferably do not exceed about 70° C. after a gold film has been vapor-deposited in the micromirror structure.

The atmosphere and the temperature may both be controlled in order to control intrinsic film stress in vapor-deposited films. For instance, titanium may be vapor-deposited in an atmosphere containing a predetermined oxygen partial pressure onto a silicon substrate which is thermally coupled to a temperature-controlling thermal source such as a Peltier stage.

Although embodiments of the invention has been described with respect to oxygen as the film stress-controlling atmospheric constituent for vapor deposition of a titanium film, it should be understood that other atmospheric constituents might be used to provide a titanium film with a tensile component of intrinsic stress. For instance, vapor deposition of titanium in an atmosphere containing water will provide the resulting film with a tensile component of intrinsic stress. Although the invention has been described with respect to titanium films, it should be understood that films of other materials, including metals such as chromium, might be vapor-deposited in controlled atmospheres and/or on temperature-controlled substrates to control their intrinsic stresses. Although the invention has been described with respect to silicon substrates, it should be understood that films might be vapor-deposited on substrates of other materials (including materials used in integrated electronic device fabrication such as silicon oxide, germanium, gallium arsenide, and indium phosphide) in controlled atmospheres and/or at controlled temperatures to control their intrinsic stresses. Although the invention has been described with respect to films deposited on flat substrates, and for which the desired final shape is substantially flat, it should be understood that films may be vapor-deposited on substrates having other initial or desired shapes in controlled atmospheres and/or at controlled temperatures to control their intrinsic stresses. For instance, because the intrinsic stress of gold films may irreversibly change upon heating during device fabrication and/or packaging processes due to creep and relaxation, a titanium-gold thin film stack may intentionally be fabricated so that the intrinsic stress of the titanium film causes a predetermined curvature, the amount of which is selected to compensate for the change in curvature caused by the expected heating of the gold film.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A devices comprising:
   a base; and
   a movable mirror resiliently mounted to the base and adapted to move with respect to the base, wherein the movable mirror comprises:
     a movable substrate having a surface of predetermined shape;
     a vapor-deposited film disposed on the surface, the film consisting essentially of titanium and oxygen; and
     a metal layer deposited over the film and adapted to reflect light, wherein:
       the titanium provides adhesion between the surface and the metal layer; and
       the oxygen substantially prevents undesired deviations from the predetermined shape by supplying a tensile component of intrinsic stress of the film which at least partially cancels a compressive component of the intrinsic stress supplied by the titanium.

2. The invention of claim 1, wherein the total intrinsic stress of the film is about zero.

3. The invention of claim 1, wherein the curvature of the mirror film is about zero.

4. The invention of claim 1, wherein the base comprises an electrostatic driving structure, wherein the mirror is movably disposed adjacent the electrostatic driving structure and adapted to move in response to an electrical signal applied to the electrostatic driving structure.

5. The invention of claim 1, wherein:
   the substrate consists essentially of silicon; and
   the metal layer comprises gold.

6. The invention of claim 1, wherein a proportion between amounts of the titanium and the oxygen is such that the intrinsic stress causes the substrate to adopt the predetermined shape.

7. The invention of claim 1, wherein the device is a MEMS device.

8. The invention of claim 1, wherein the vapor-deposited film reduces curvature of the surface that would otherwise exist in absence of the vapor-deposited film.

9. The invention of claim 1, wherein each of said film and said metal layer covers said surface substantially entirely.

10. The invention of claim 1, wherein:
    the curvature of the mirror is about zero;
    each of said film and said metal layer covers said surface substantially entirely;
    the substrate consists essentially of silicon;
    the metal layer comprises gold; and
    the device is a MEMS device, wherein the base comprises an electrostatic driving structure, wherein the mirror is movably disposed adjacent the electrostatic driving structure and adapted to move in response to an electrical signal applied to the electrostatic driving structure.

* * * * *

UNITED STATES PATENT AND TRADEMARK OFFICE
CERTIFICATE OF CORRECTION

| | | |
|---|---|---|
| PATENT NO. | : 7,122,872 B2 | Page 1 of 1 |
| APPLICATION NO. | : 10/441458 | |
| DATED | : October 17, 2006 | |
| INVENTOR(S) | : James F. Bailey et al. | |

It is certified that error appears in the above-identified patent and that said Letters Patent is hereby corrected as shown below:

In column 10, line 4, replace "mirror film is about zero" with --mirror is about zero--.

Signed and Sealed this

Thirtieth Day of January, 2007

JON W. DUDAS
*Director of the United States Patent and Trademark Office*